(12) United States Patent
Takeda et al.

(10) Patent No.: US 7,087,933 B2
(45) Date of Patent: Aug. 8, 2006

(54) LIGHT-EMITTING SEMICONDUCTOR DEVICE AND METHOD OF FABRICATION

(75) Inventors: Shiro Takeda, Niiza (JP); Hitoshi Murofushi, Niiza (JP)

(73) Assignee: Sanken Electric Co., Ltd. (JP)

( * ) Notice: Subject to any disclaimer, the term of this patent is extended or adjusted under 35 U.S.C. 154(b) by 0 days.

(21) Appl. No.: 10/987,770

(22) Filed: Nov. 12, 2004

(65) Prior Publication Data
US 2005/0110037 A1 May 26, 2005

(30) Foreign Application Priority Data
Nov. 21, 2003 (JP) ............................. 2003-392944

(51) Int. Cl.
*H01L 29/22* (2006.01)
(52) U.S. Cl. ............................. 257/94; 257/79; 257/98; 257/103
(58) Field of Classification Search .................. 257/79, 257/94, 98, 103
See application file for complete search history.

(56) References Cited

U.S. PATENT DOCUMENTS 6,869,820 B1 * 3/2005 Chen ........................... 438/79
2003/0003613 A1 * 1/2003 Hsieh et al. .................. 438/22

FOREIGN PATENT DOCUMENTS

JP        2002-217450       8/2002

* cited by examiner

*Primary Examiner*—Andy Huynh
(74) *Attorney, Agent, or Firm*—Woodcock Washburn, LLP

(57) ABSTRACT

A light emitting diode has a semiconductor region for production of light. The semiconductor region is a lamination of two complementary layers, an n-type semiconductor layer, an active layer, a p-type semiconductor layer, another complementary layer, and an ohmic contact layer, in that order from a first major surface of the semiconductor layer, from which the light is emitted, toward a second. A reflective metal layer covers the second major surface of the semiconductor region via a transparent layer for reflecting the light that has traveled through the transparent layer from the semiconductor region. The transparent layer serves to prevent the semiconductor region and the reflective layer from alloying by heat treatments during the manufacture of the LED.

10 Claims, 2 Drawing Sheets

US 7,087,933 B2

LIGHT-EMITTING SEMICONDUCTOR DEVICE AND METHOD OF FABRICATION

CROSS REFERNCE TO RELATED APPLICATIONS

This application claims priority to Japanese Patent Application No.2003-392944, filed Nov. 21, 2003.

BACKGROUND OF THE INVENTION

This invention relates to a light-emitting semiconductor device, or light-emitting diode according to more common parlance, and more particularly to such devices having active layers made from chemical compounds such for example as aluminum gallium arsenide (AlGaAs), aluminum gallium indium phosphide (AlGaInP), and gallium nitride (GaN). The invention also concerns a method of making such light-emitting devices.

Compound semiconductors containing AlGaInP, for instance, represent familiar materials of light-emitting semiconductor devices. An example of such device has a substrate of gallium arsenide (GaAs) on which there are laminated a plurality of active semiconductor layers composed primarily of AlGaInP. The active semiconductor layers for generating light include an n-type semiconductor layer, an active layer and a p-type semiconductor layer. The AlGaInP semiconductor layers are relatively easy to grow on the GaAs substrate by epitaxy.

One of the problems encountered with this conventional light-emitting device is that the GaAs substrate is highly absorptive of the light in the wavelength range emitted by the active semiconductor layers. Much of the light that has issued from the active semiconductor layers toward the substrate has been absorbed thereby, running counter to the objective of making the light-emitting device as high as feasible in efficiency.

A known remedy to this problem was to remove the GaAs substrate following the epitaxial growth of the active semiconductor layers thereon. A transparent support substrate of gallium phosphide (GaP) or the like, different from the removed growth substrate which had been used for epitaxial growth of the active layers, was then bonded to the active semiconductor layers. Then a reflective electrode was formed on the support substrate. This remedy proved unsatisfactory, however, as the active semiconductor layers and the transparent support substrate gave rise to electrical resistance at the interface therebetween. This resistance made the forward voltage between the anode and cathode of the light emitting device inconveniently high.

A solution to this weakness is found in Japanese Unexamined Patent Publication No. 2002-217450. This prior application teaches the creation of thin, isolated regions of gold-germanium-gallium (Au—Ge—Ga) alloy on the underside of the active semiconductor layers. The Au—Ge—Ga alloy is favorable from the standpoint of ohmic contact but not very reflective. The isolated alloy regions as well as the exposed surface of the active semiconductor layers were therefore covered with a layer of aluminum or like reflective metal. To this reflective layer was bonded a support substrate of electrically conductive silicon or like material.

The aluminum layer makes no satisfactory ohmic contact with the exposed surface of the active semiconductor layers. But the Au—Ge—Ga alloy regions do make good ohmic contact with both the active semiconductor layers of AlGaInP or the like and the aluminum layer. The result was a reduction in the forward voltage between anode and cathode. The aluminum layer is inherently capable of reflecting much of the light coming from the active semiconductor layers toward the support substrate.

However, this second recited prior art device also proved to have its own weaknesses. One of these weaknesses arose in conjunction with the manufacturing process of the device, which involved several heat treatments. Undesired reactions took place as a result of such heat treatments between the reflective metal layer, the Au—Ge—Ga alloy regions, and the neighboring part of the active semiconductor layers. The result was a diminution of reflectivity at their interfaces. High-efficiency light-emitting devices were therefore not obtainable with as high a yield as had been expected.

Another weakness concerned the isolated regions of Au—Ge—Ga alloy on the underside of the active semiconductor layers. These isolated alloy regions made it difficult to fulfill both of the objectives of higher efficiency of light emission and the reduction of the forward voltage. The greater the Au—Ge—Ga alloy regions were made in size with respect to the surface area of the active semiconductor layers for better ohmic contact, the lower could be the forward voltage, but at the same time the less was the efficiency of light emission. This reduction of efficiency came from less reflection of light from the active semiconductor layers by the aluminum layer because of the isolated regions of larger size interposed therebetween. Thus, as far as this prior art device was concerned, the fulfillment of the noted dual objective was a self-contradictory requirement.

SUMMARY OF THE INVENTION

The present invention seeks to improve the efficiency of light-emitting semiconductor devices of the class defined, without the difficulties encountered heretofore.

Briefly, the invention may be summarized as a light-emitting semiconductor device of improved efficiency. Included is a semiconductor region comprising a first and a second semiconductor layer for generating light. The semiconductor region has a first major surface at which the first semiconductor layer is exposed and from which the light is emitted, and a second major surface, opposite to the first major surface, at which the second semiconductor layer is exposed. A transparent layer of electrically conducting material, pervious to the light generated by the semiconductor region, is formed in ohmic contact with the second major surface of the semiconductor region. A reflective metal layer covers the transparent layer for reflecting the light that has traveled through the transparent layer from the semiconductor region. A first electrode is formed on the semiconductor region and electrically connected to the first semiconductor layer, and a second electrode is electrically connected to a preselected one of the transparent layer and the reflective metal layer.

The light-emitting semiconductor device according to the invention may be either in the form of a completed product or in semifinished form, with no electrodes attached, such as commonly called a chip.

The invention particularly features the transparent layer of electrically conducting material interposed between the semiconductor region and the reflective metal layer. Making ohmic contact with both semiconductor region and reflective metal layer, the transparent layer prevents the alloying reaction thereof. The reflective metal layer has proved to reflect the light more favorably than in the prior art case where it makes direct contact with the semiconductor region. Made from the materials to be set forth subsequently, the transparent layer absorbs less light than does the conventional Au—Ge—Ga alloy layer. All in all, a greater percentage of the light coming from the semiconductor region can be reflected than heretofore, realizing a substantive improvement in the efficiency of light emission.

As an additional advantage, the reflective metal layer makes ohmic contact with a greater surface area of the neighboring part (i.e. transparent layer) than does the reflective metal layer of Japanese Unexamined Patent Publication No. 2002-217450, supra. This serves to less the resistivity of the current path during light emission, to diminish the forward voltage and power loss, and hence to enhance the efficiency of the device.

Preferably, the semiconductor region may be made from Group III–V compound semiconductors. The second semiconductor layer of the semiconductor region, in particular, may be made from a compound semiconductor containing arsenic, such as gallium arsenide and aluminum gallium arsenide. Fabricated from any of these aluminum-containing compound semiconductors, the second semiconductor layer will make low-resistivity contact with the transparent layer, resulting in further reduction in voltage requirement.

The transparent layer may be made from metal oxides that are transparent to the light to be generated, such as a mixture of indium oxide and stannic oxide, aluminum-doped zinc oxide, fluorine-doped stannic oxide, zinc oxide, stannous oxide, zinc-selenium alloy, and gallium oxide. Made from any one or more of these materials, the transparent layer will make low-resistance contact with both reflective metal layer and semiconductor region and be favorable in transparency. The transparent layer will well perform the functions of transmitting the light from the semiconductor region toward the reflective metal layer and vice versa with a minimum of attenuation, and of preventing the diffusion of the metal from the reflective metal layer into the semiconductor region.

The preferred thickness of the transparent layer is from about 10 nanometers to about one micrometer. With a thickness of not less than about 10 nanometers, the transparent layer has proved effective to prevent the metal and semiconductor materials of the reflective metal layer and semiconductor layer from diffusing into each other and so creating an alloy layer that is highly absorptive of light. Made not more than about one micrometer thick, on the other hand, the transparent layer will attenuate the light to no substantive degree and so incur little or no diminution in external quantum efficiency.

The reflective metal layer may be made from one or more of such reflective metals as aluminum, silver, gold, and copper, to cover the entire surface of the transparent layer for reflecting the light coming from the semiconductor region in a direction away from the light-emitting surface of the device. Of the listed reflective metals, aluminum and silver in particular will reflect visible light of a wide wavelength range. Copper and gold on the other hand will be especially effective with visible light of relatively long wavelength.

An ancillary feature of the invention is a baseplate of electrically conductive material attached, as by bonding, to the reflective metal layer. The baseplate will provide stable mechanical support for the laminated semiconductor region, transparent layer, and reflective layer.

Preferably, the noted second electrode (anode in the illustrated embodiments) can be formed on the baseplate and electrically coupled to the transparent layer via the baseplate and reflective metal layer. The second electrode will then be fabricated most easily.

A further ancillary feature of the invention resides in a contact layer interposed between the second semiconductor layer of the semiconductor region and the transparent layer. The desired thickness and refractivity of the contact layer will be defined by mathematic formulas in the subsequent detailed description. The contact layer of such physical characteristics has proved most effective to prevent the light reflected from the reflective metal layer from being totally reflected again at the interface between the semiconductor region and the transparent layer. The reflection from the reflective metal layer will thus most efficiently travel on to the light-emitting first major surface of the semiconductor region.

Another aspect of the invention concerns a method of making the light-emitting semiconductor device. For most expediting the manufacturing process there is employed a semiconductor substrate that is used solely for growing thereon the constituent layers of the light-emitting device. The semiconductor region is first grown on this semiconductor substrate with the light-emitting first major surface of the semiconductor region held against the substrate. Then the transparent layer and reflective metal layer are formed successively on the second major surface of the semiconductor region. Then a baseplate of electrically conducting material is bonded to the reflective metal layer. The substrate is removed either before or after the bonding of the baseplate to the reflective metal layer. Then one electrode is formed on the semiconductor region, and another on the baseplate.

The above and other objects, features and advantages of this invention will become more apparent, and the invention itself will best be understood, from a study of the following description and appended claims, with reference had to the attached drawings showing the preferred embodiments of the invention.

DESCRIPTION OF THE PREFERRED EMBODIMENTS

Figure 1:
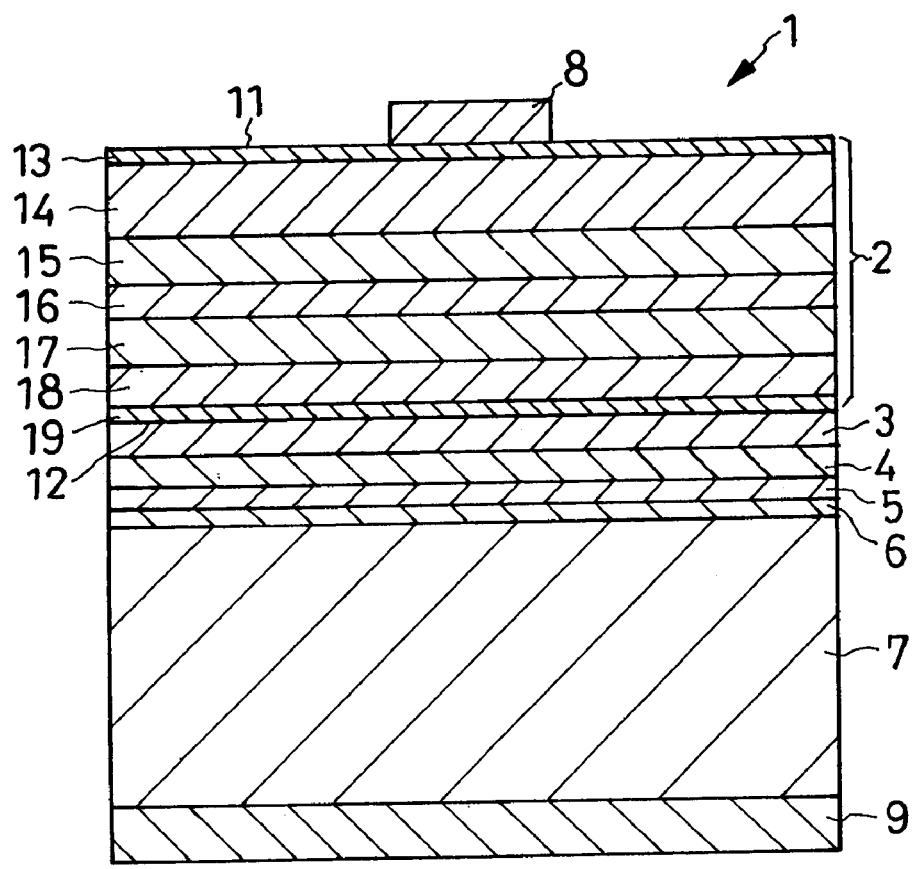
FIG. 1 is a schematic cross section through a preferred form of light emitting diode embodying the principles of this invention.

The present invention is currently believed to be best embodied in the double heterojunction light emitting diode (LED) shown in FIG. 1 and therein generally designated 1. The LED has a semiconductor region 2 where light is produced and which is composed of several laminated layers to be set forth shortly. Under this semiconductor region 2 there are provided a transparent layer 3, a reflective metal layer 4, two bonding metal layers 5 and 6, and a baseplate 7 of conductive silicon. The baseplate 7 serves mostly for providing mechanical support and is different from the substrate (shown at 10 in FIG. 2) that is used for growing thereon the constituent layers of the semiconductor region 2 and various other layers during the manufacture of the LED, as will become more apparent as the description proceeds. A first electrode or cathode 8 is arranged centrally on top of the semiconductor region 2. A second electrode or anode 9 underlies the baseplate 7.

Composed of the compound semiconductors of Groups III–V elements, the semiconductor region 2 is a lamination of an n-type first complementary layer 13, an n-type second complementary layer 14, an n-type semiconductor layer 15 as the first semiconductor layer, an active layer 16, a p-type semiconductor layer 17 as the second semiconductor layer, a p-type third complementary layer 18, and a p-type contact layer 19, arranged in that order from one major surface 11 of the semiconductor region 2 toward the other 12. The light generated by the active layer 16 is emitted from the major surface 11.

Out of the constituent layers of the semiconductor region 2, it is the n-type semiconductor layer 15, active layer 16 and p-type semiconductor layer 17 that are essential for light production in this double heterojunction LED. The complementary layers 13, 14 and 18 and contact layer 19 are unessential; indeed, all or some of these unessential layers may be omitted. Even the active layer 16 may be omitted if the LED need not be of double heterojunction configuration. It is therefore only the semiconductor layers 15 and 17 of the different conductivity types that are indispensable constituents of the semiconductor region 2.

Interposed between the semiconductor layers 15 and 17, the active layer 16 is made from any of the Group III–V compound semiconductors that are generally expressed as:

$$Al_xGa_yIn_{1-x-y}P$$

where x and y are both equal to or greater than zero and equal to or less than one, and (x+y) is also equal to or greater than zero and equal to or less than one. The active layer 16 can also be fabricated from materials that are expressed by the general formula $Al_xGa_yI_{1-x-y}N$.

No conductivity determinant is added to the active layer 16 in this embodiment of the invention. In practice, however, the active layer 16 might be doped with a p-type determinant to a concentration less than that of the p-type semiconductor layer 17, or with an n-type determinant to a concentration less than that of the n-type semiconductor layer 15. The showing of the single active layer 16 in FIG. 1 is for the sake of simplicity only; in practice, it may take the form of either multiple or single quantum well configuration.

The semiconductor layer 15 overlying the active layer 16 may be fabricated from any of the Group III–V compound semiconductors that can be generally defined as:

$$Al_xGa_yIn_{1-x-y}P$$

where x is equal to or greater than zero and less than one; y is equal to or greater than zero and equal to or less than one; and (x+y) is equal to or greater than zero and equal to or less than one. An n-type impurity such as silicon is added to any such compound semiconductor. The semiconductor layer 15 can also be fabricated from materials that are expressed by the general formula $Al_xGa_yIn_{1-x-y}N$.

In order to cause emission of the greatest possible percentage of the light generated in the active layer 16, the proportion x of aluminum in the semiconductor layer 15 should be greater than that of the active layer 16, preferably from 0.15 to 0.45, and most desirably from 0.2 to 0.4. The gallium proportion y of the semiconductor layer 15 is from 0.15 to 0.35, or from 0.4 to 0.6 for the best results. The concentration of the n-type impurity in this layer 15 may be not less than $5 \times 10^{17}$ cm$^{-3}$. The bandgap of the layer 15 is greater than that of the active layer 16.

The semiconductor layer 17 underlying the active layer 16 may be of any of the Group III–V compound semiconductors that can be generally defined as:

$$Al_xGa_yIn_{1-x-y}P$$

where x and y are both equal to or greater than zero and equal to or less than one, and (x+y) is also equal to or greater than zero and equal to or less than one. A p-type impurity such as zinc is added to any such compound semiconductor. The semiconductor layer 17 can also be fabricated from materials that are expressed by the general formula $Al_xGa_yIn_{1-x-y}N$.

In order to cause emission of the greatest possible percentage of the light generated in the active layer 16, the aluminum proportion x of the semiconductor layer 17 should be greater than that of the active layer 16, from 0.15 to 0.50 for the best results. The concentration of the p-type impurity in this layer 17 may be not less than $5 \times 10^{17}$ cm$^{-3}$. The bandgap of the layer 17 is greater than that of the active layer 16.

The second complementary layer 14 on the semiconductor layer 15 could be called a current spreading layer as it serves primarily for constancy of forward current distribution by spreading the current outwardly of the cathode 8 as seen in a direction normal to the major surface 11 of the semiconductor region. The second complementary layer 14 also functions to spread toward the lateral edges of the device the light that has been generated at the active layer 16. The material chosen for the second complementary layer 14 in this embodiment of the invention is n-type GaAs, although other n-type Group III–V compound semiconductors could be employed as well, examples being GaP, $Ga_xIn_{1-x}P$, $Al_xGa_{1-x}As$, GaN, $Ga_xIn_{1-x}N$, or $Al_xGa_{1-x}N$. The second complementary layer 14 could also called a buffer layer.

The topmost n-type first complementary layer 13 could be termed a contact layer, being intended primarily for good ohmic contact with the cathode 8. The secondary function of this complementary layer 13 is an etching stopper during manufacture of the LED, as will be detailed presently. The first complementary layer can be made from any of the Group III–V compound semiconductors that can be generally defined as:

$$Al_xGa_yIn_{1-x-y}P$$

where x and y are both equal to or greater than zero and equal to or less than one, and (x+y) is also equal to or greater than zero and equal to or less than one. An n-type impurity is added to any such compound semiconductor. The first complementary layer 13 can also be fabricated from materials that are expressed by the general formula $Al_xGa_yIn_{1-x-y}N$.

The third complementary layer 18 underlying the semiconductor layer 17 might also be termed a current spreading layer as its primary function was to make constant the distribution of forward current. The third complementary layer 18 is designed more specifically to spread the current outwardly of the cathode 8 as seen in a direction normal to the major surface 11 of the semiconductor region 2. Preferred materials for the third complementary layer 2 include p-type GaP and p-type GaN, although other III–V compound semiconductors might be adopted as well. The third complementary layer 18 could also called a buffer layer.

Underlying the third complementary layer 18 and exposed at the second major surface 12 of the semiconductor region 2, the p-type contact layer 19 is intended for good ohmic contact with the transparent layer 3 which constitutes a feature of this invention. The contact layer 19 can be made from III–V compound semiconductors containing arsenide. A particularly preferred material is p-type GaAs, although p-type AlGaAs, p-type GaN, and p-type AlGaN could be used as well.

The thickness of the contact layer 19 may be determined according to the equation:

$$T=(2m+1)\times(\lambda/4n_1)\pm\lambda/8n_1$$

wherein:

T=thickness of the contact layer 19
m=either of 0, 1, and 2
$\lambda$=wavelength of the light generated at the active layer 16
$n_1$=refractivity of the contact layer 19.

The refractivity $n_1$ of the contact layer 19 should be in the range of $(n_2\times n_3)^{1/2}\times 0.8$ through $(n_2\times n_3)^{1/2}\times 1.2$, where $n_2$ is the refractivity of the transparent layer 3, and $n_3$ is the refractivity of the third complementary layer 18.

With the thickness T and refractivity $n_1$ of the contact layer 19 determined as above, the light that has been reflected at the interface between transparent layer 3 and reflective metal layer 4 can be prevented from total reflection at the interface between transparent layer 3 and contact layer 19. As a result, upon reflection at the interface between transparent layer 3 and reflective metal layer 4, the light will issue from the major surface 11 of the semiconductor region 2 with a minimum of loss.

The transparent layer 3 is electrically conductive, pervious to the light generated at the semiconductor region 2, and makes ohmic contact with the entire major surface 12 of the semiconductor region 2 or of the p-type contact layer 19. The transparency of the transparent layer 3 with respect to the light generated in the semiconductor region 2 should be higher than that of the semiconductor region 2. Preferably, the transparent layer 3 should pass approximately sixty percent or more of the incoming light.

The transparent layer 3 should be made from such a material, and by such a method, that no alloying or no mutual diffusion occurs with the neighboring reflective metal layer 4. Substances meeting these requirements are some metal oxides or compounds, preferred examples being a mixture (hereinafter referred to as ITO) of indium oxide ($In_2O_3$) and stannic oxide or tin peroxide ($SnO_2$), zinc oxide doped with aluminum (hereinafter referred to as AZO), $SnO_2$ doped with fluorine (hereinafter referred to as FTO), zinc oxide (ZnO), stannous oxide (SnO), zinc-selenium (Zn—Se) alloy, and gallium oxide (GaO), which may be employed singly or in combination of two or more. Currently believed most desirable of these is ITO. The transparent layer 3 can be formed by either sputtering or chemical vapor deposition or vacuum deposition.

The transparent layer 3 should be from about 10 nanometers to about one micrometer thick. Below this desired thickness range the transparent layer 3 might fail to prevent the alloying of the semiconductor region 2 and reflective metal layer 4. Above that range, on the other hand, the transparent layer 3 would attenuate the incoming light so much as to deteriorate the external quantum efficiency. The transparent layer 3 may cover not less than a half, all for the best results, of the major surface 12 of the semiconductor region 2.

The reflective metal layer 4 covers the entire surface of the transparent layer 3 for reflecting the light coming from the semiconductor region 2. One or more of metals such as aluminum, silver, gold and copper may be employed to make the reflective metal layer. Aluminum is used in this embodiment for its inexpensiveness. The reflective metal layer 3 may also cover not less than a half, all for the best results, of the surface of the transparent layer 3 or of the surface 12 of the semiconductor region 2. The reflective metal layer 3 may be formed to a thickness ranging from 0.05 to 1.00 micrometer for sufficient reflection of the light.

The electrically conductive baseplate 7 is joined to the reflective metal layer 4 via the two bonding metal layers 5 and 6 for mechanically supporting and protecting the semiconductor region 2 and the transparent layer 3 and reflective layer 4. The bonding metal layers 5 and 6 may both be made from gold or like metal. Formed in thin sheet on both the reflective layer 4 and the baseplate 7, the bonding metal layers 5 and 6 are united with each other under heat and pressure for joining the baseplate 7 to the reflective layer 4. The conductive baseplate 7 may be fabricated from silicon, doped with a conductivity determinant, to a thickness of 300 micrometers. The silicon baseplate is recommended for its cheapness and ease of machining.

The cathode 8 is mounted centrally on the surface 11 of the semiconductor region 11, or of the first complementary layer 13, in ohmic contact therewith. The light is to issue from that part of the surface 11 which is left uncovered by the cathode 8. Alternatively, the cathode may take the form of the combination of a transparent electrode such as that of ITO and a bonding pad. It is also envisaged within the scope of this invention to connect the cathode to any of the complementary layers 13 and 14 and semiconductor layer 15.

The anode 9 underlies the silicon baseplate 7, covering its entire bottom surface. A metal-made baseplate may be adopted in substitution for the silicon baseplate, in which case the anode 9 will be unnecessary.

Method of Manufacture

Figure 2:
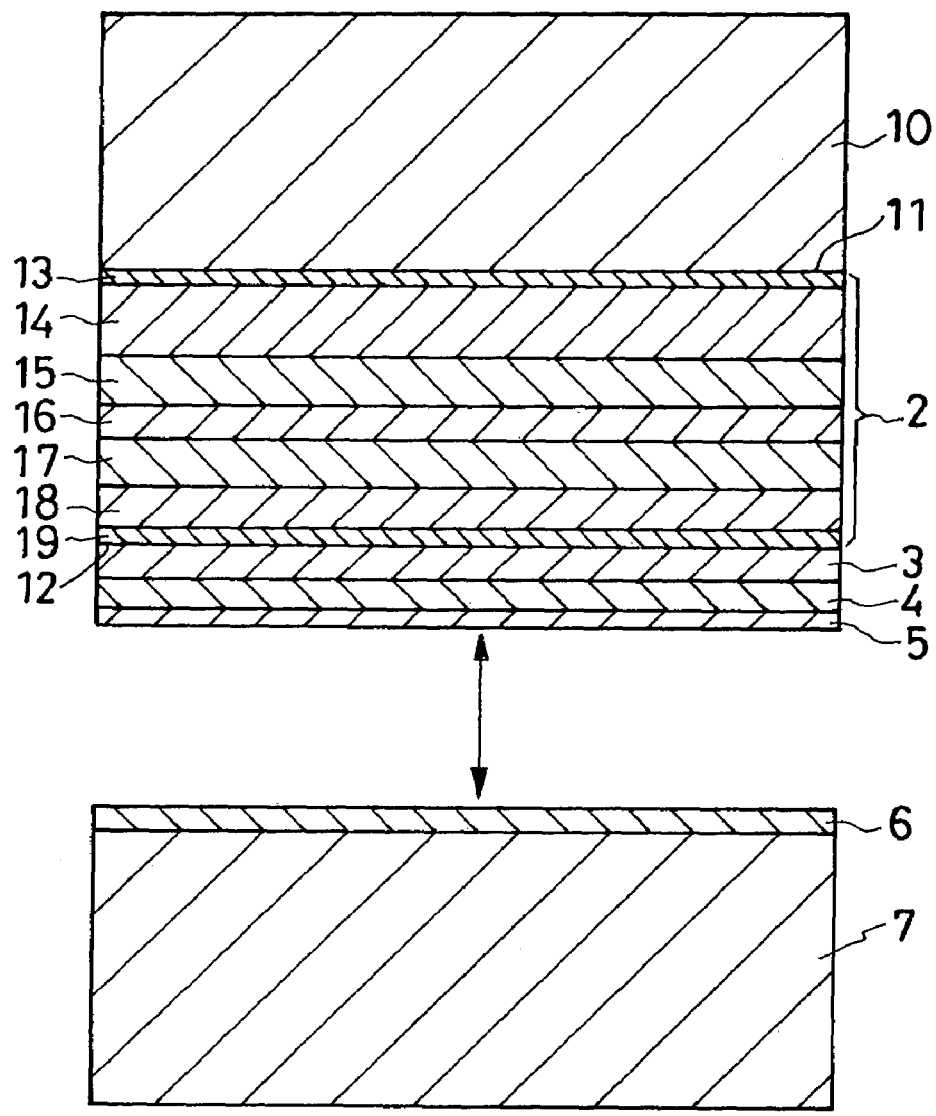
FIG. 2 is a view somewhat similar to FIG. 1 but illustrative of a product during the manufacture of the light emitting diode.

The fabrication of the FIG. 1 LED 1 started with the preparation of a semiconductor substrate 10, FIG. 2, of GaAs. The semiconductor region 1 was formed on this GaAs substrate 10 by successively growing by epitaxy the n-type fist complementary layer 13, n-type second complementary layer 14, n-type semiconductor layer 15, active layer 16, p-type semiconductor layer 17, p-type third complementary layer 18, and p-type contact layer 19, all using the familiar apparatus for metal organic chemical vapor deposition (MOCVD).

Then the transparent layer 3 was formed on the entire exposed surface of the contact layer 19 by depositing ITO thereon. Either sputtering or chemical vapor deposition or vacuum deposition could be adopted for creation of the transparent layer 3. Then the reflective layer 4 of aluminum was formed on the transparent layer 3. Then the bonding layer 5 of gold was formed on the reflective layer 4.

Then, as illustrated in FIG. 2, there was prepared the baseplate 7 of doped silicon which, as has been stated, was to function as a mechanical support for the other constituent parts 2–5 of the LED. The bonding layer 6 of gold was formed on one of the opposite major surfaces of the baseplate 7 by vacuum deposition. Then the bonding layers 5 and 6 were held against each other under pressure and heated to a temperature not exceeding 300° C., thereby causing the bonding layers 5 and 6 to unite with each other by the mutual diffusion of gold. The baseplate 7 was thus integrally joined to the combination of the semiconductor region 2, transparent layer 3 and reflective layer 4 via the bonding layers 5 and 6.

Then the GaAs substrate 10 was etched away from the first complementary layer 13 of the semiconductor region 2. The substrate 10 could have been removed, however, before the baseplate 7 is bonded as above to the reflective layer 4. The LED 1 was completed as the cathode 8 and anode 9 were subsequently formed on the semiconductor region 2 and on the baseplate 7.

The advantages gained by this particular embodiment of the invention may be enumerated as follows:

1. The semiconductor region 2 and reflective layer 4 is effectively prevented from alloying during heat treatments in the course of LED manufacture by virtue of the transparent layer 3 of electrically conductive material interposed therebetween. The alloying reaction would seriously affect the functioning of the reflective layer 4. The invention enables the production of high efficiency light-emitting device with a high yield.

2. Created by sputtering, CVD or vacuum deposition of a metal oxide, the transparent layer 3 makes ohmic contact with the semiconductor region 2 and reflective layer 4 with little or no alloying. As a result, these interfaces absorb only a minimum of light and have a minimum of resistivity, contributing toward a higher efficiency of light emission and a lower operating voltage requirement.

3. Both transparent layer 3 and reflective layer 4 cover practically all the major surface 12 of the semiconductor region. The large areas of ohmic contact serve to reduce the resistivity between cathode 8 and anode 9 during application of forward voltage to the LED 1.

4. The contact layer 19 also practically wholly covers the surface of the semiconductor region 2, resulting in a greater levelness of the semiconductor region surface than in the noted prior art and so expediting the firm bonding of the silicon baseplate 7.

5. The contact layer need not be patterned.

EMBODIMENT OF FIG. 3

Figure 3:
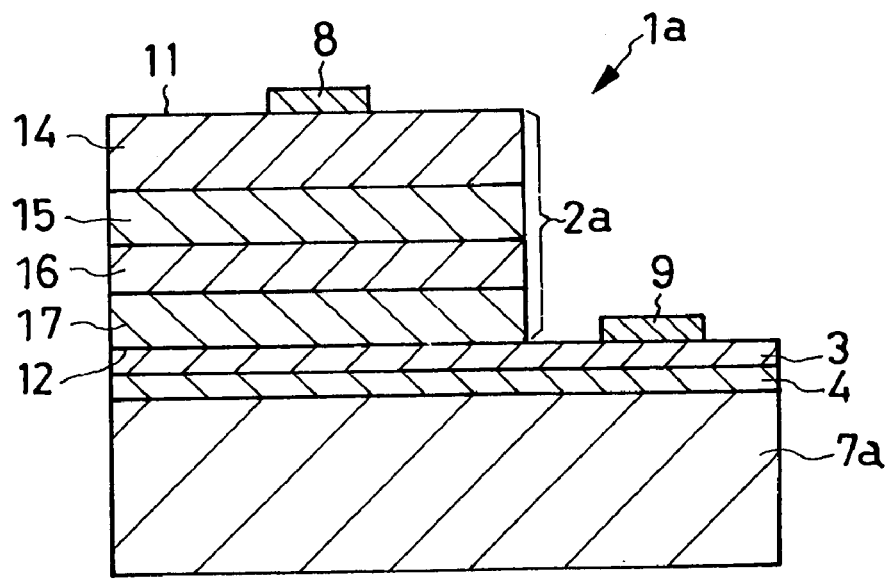
FIG. 3 is a view similar to FIG. 1 but showing another preferred embodiment of the invention.

FIG. 3 illustrates another preferred form of LED 1a according to the invention, which differs from the FIG. 1 device in having a modified semiconductor region 2a, modified baseplate 7a, and modified positioning of the anode 9. The modified semiconductor region 2a is akin to its FIG. 1 counterpart 2 except for the absence of the first and third complementary layers 13 and 18 and contact layer 19. The cathode 8 is therefore mounted on the surface 11 of the complementary layer 14, which may be more aptly termed the current spreading layer in this alternate embodiment of the invention.

The modified baseplate 7a and the transparent layer 3 and reflective layer 4 thereon have portions projecting laterally beyond the overlying semiconductor region 2a. The anode is arranged on the ledge or ledges thus formed by the baseplate 7a and layers 3 and 4, making direct contact with the transparent layer 3. The reflective layer 4 is coupled directly to the baseplate 7a. The baseplate 7a is fabricated from a metal that is a good conductor of heat, for the purpose of greater heat radiation. The LED 1a is similar to the FIG. 1 embodiment in all the other details of construction.

It will be noted that in this LED 7a, too, the reflective layer 4 is joined to the surface 12 of the semiconductor region 2a via the transparent layer 2. Thus the LED 1a gains the same advantages as does the FIG. 1 LED 1.

Notwithstanding the foregoing detailed disclosure it is not desired that the present invention be limited by the exact showing of the drawings or the description thereof. The following is a brief list of possible modifications, alterations or adaptations of the illustrated embodiments which are all believed to fall within the scope of the invention:

1. The semiconductor region 2 or 2a could be constituted, as has been mentioned, solely of the semiconductor layers 15 and 17 and active layer 16 for light production, or if the double heterostructure is undesired, of only the semiconductor layers 15 and 17 of opposite conductivity types. In either of these alternative cases the pair of opposite major surfaces 11 and 12 of the semiconductor region will be provided respectively by the semiconductor layers 15 and 17; in other words, the semiconductor layers 15 and 17 will be exposed respectively at the opposite major surfaces 11 and 12 of the semiconductor region.

2. The cathode 8 need not necessarily be arranged on the first major surface 11 of the semiconductor region 2 or 2a, all that is required being that the anode be electrically connected to the layer (e.g. complementary layer 13, current spreading layer 14, or semiconductor layer 15) which is exposed at the first major surface 11.

3. The baseplate 7 or 7a will be unnecessary if the semiconductor region 2 or 2a has sufficient mechanical strength to be self-supporting. The reflective metal layer 4 will then serve an additional purpose as cathode.

4. The layers 13–15 and 17–19 of the semiconductor region 2 or 2a may be reversed in conductivity type.

What is claimed is:

1. A light-emitting semiconductor device of improved efficiency, comprising:
   (a) a semiconductor region comprising a first and a second semiconductor layer for generating light, the semiconductor region having a first major surface at which the first semiconductor layer is exposed and from which the light is emitted, and a second major surface, opposite to the first major surface, at which the second semiconductor layer is exposed;
   (b) a first electrode electrically connected to the first semiconductor layer;
   (c) a transparent layer of electrically conducting material in ohmic contact with substantially all of the second major surface of the semiconductor region, the transparent layer being pervious to the light generated by the semiconductor region;
   (d) a reflective metal layer covering the transparent layer for reflecting the light that has traveled through the transparent layer from the semiconductor region; and
   (e) a second electrode electrically connected to a preselected one of the transparent layer and the reflective metal layer.

2. The light-emitting semiconductor device of claim 1 wherein the second semiconductor layer of the semiconductor region is made from a compound semiconductor containing arsenic.

3. The light-emitting semiconductor device of claim 1 wherein the transparent layer is made from a metal oxide.

4. The light-emitting semiconductor device of claim 3 wherein the transparent layer is made from at least either of a mixture of indium oxide and tin oxide, zinc oxide doped with aluminum, tin oxide doped with fluorine, zinc oxide, stannous oxide, zinc-selenium alloy, and gallium oxide.

5. The light-emitting semiconductor device of claim 1 wherein the transparent layer is from 10 nanometers to one micrometer thick.

6. The light-emitting semiconductor device of claim 1 wherein the transparent metal layer is made from at least either of aluminum, silver, gold, and copper.

7. The light-emitting semiconductor device of claim 1 further comprising a baseplate of electrically conducting material joined to the reflective metal layer.

8. The light-emitting semiconductor device of claim 7 wherein the second electrode is mounted to the baseplate and electrically connected to the transparent layer via the baseplate and the reflective layer.

9. The light-emitting semiconductor device of improved efficiency, comprising:
   (a) a semiconductor region comprising a first and a second semiconductor layer for generating light, the semiconductor region having a first major surface at which the first semiconductor layer is exposed and from which the light is emitted, and a second major surface, opposite to the first major surface, at which the second semiconductor layer is exposed;
   (b) a first electrode electrically connected to the first semiconductor layer;
   (c) a transparent layer of electrically conducting material in ohmic contact with the second major surface of the semiconductor region, the transparent layer being pervious to the light generated by the semiconductor region;
   (d) a contact layer interposed between the second semiconductor layer of the semiconductor region and the transparent layer for ohmic contact with the latter, the contact layer having a thickness determined according to the equation:

$$T = (2m+1) \times (\lambda/4n_1) \pm \lambda/8n_1$$

wherein:
T=thickness of the contact layer
m=either of 0, 1, and 2
$\lambda$=wavelength of the light generated by the semiconductor region
$n_1$=refractivity of the contact layer;
and wherein the refractivity $n_1$ of the contact layer is in the range of from $(n_2 \times n_3)^{1/2} \times 0.8$ to $(n_2 \times n_3)^{1/2} \times 1.2$, where $n_2$ is the refractivity of the transparent layer, and $n_3$ is the refractivity of a constituent layer of the semiconductor region which is in contact with the contact layer;
   (e) a reflective metal layer covering the transparent layer for reflecting the light that has traveled through the transparent layer from the semiconductor region; and
   (f) a second electrode electrically connected to a preselected one of the transparent layer and the reflective metal layer.

10. A method of making a light-emitting semiconductor device of improved efficiency, which comprises:
   (a) providing a semiconductor substrate;
   (b) growing on the semiconductor substrate a semiconductor region comprising a first and a second semiconductor layer for generating light, the semiconductor region having a first major surface which is held against the semiconductor substrate and at which the first semiconductor layer is exposed and from which the light is to be emitted, and a second major surface, opposite to the first major surface, at which the second semiconductor layer is exposed;
   (c) creating a transparent layer of electrically conducting material in ohmic contact with substantially all of the second major surface of the semiconductor region, the transparent layer being pervious to the light generated by the semiconductor region;
   (d) creating a reflective metal layer on the transparent layer for reflecting the light that has traveled through the transparent layer from the semiconductor region;
   (e) bonding a baseplate of electrically conducting material to the reflective metal layer;
   (f) removing the semiconductor substrate from the semiconductor region;
   (g) forming a first electrode electrically connected to the first semiconductor layer; and
   (h) forming a second electrode on the baseplate.

* * * * *